(12) United States Patent
Malmsten

(10) Patent No.: US 6,229,450 B1
(45) Date of Patent: May 8, 2001

(54) POWER INTERRUPTION MONITORING APPARATUS

(75) Inventor: David A. Malmsten, Taylor, MI (US)

(73) Assignee: The Detroit Edison Company, MI (US)

( * ) Notice: Subject to any disclaimer, the term of this patent is extended or adjusted under 35 U.S.C. 154(b) by 0 days.

(21) Appl. No.: 09/249,413

(22) Filed: Mar. 15, 1999

(51) Int. Cl.$^7$ .................................................. G08B 21/00
(52) U.S. Cl. .......................... 340/652; 340/638; 340/644; 340/656; 340/691.5; 340/691.6; 340/693.5; 702/176; 968/DIG. 1
(58) Field of Search ...................................... 340/635, 638, 340/644, 652, 656, 659, 691.1, 691.5, 691.6, 693.5; 702/176; 968/DIG. 1

(56) References Cited

U.S. PATENT DOCUMENTS

| | | | |
|---|---|---|---|
| 3,958,212 | * | 5/1976 | Henthorne ............................ 340/656 |
| 4,097,843 | * | 6/1978 | Basile .................................... 340/656 |
| 4,466,074 | * | 8/1984 | Jindrick et al. ........................ 702/126 |
| 4,584,651 | | 4/1986 | Carey, Jr. et al. .................... 702/176 |
| 5,148,686 | * | 9/1992 | You ........................................ 62/234 |
| 5,410,581 | | 4/1995 | Hollenbeck et al. .................. 377/28 |
| 5,485,363 | * | 1/1996 | Reitwiesner ........................... 361/28 |
| 5,568,398 | * | 10/1996 | Trainor ................................ 700/298 |
| 5,568,529 | | 10/1996 | Masuda ................................. 377/16 |
| 5,663,711 | | 9/1997 | Sanders et al. ...................... 340/635 |
| 5,684,710 | | 11/1997 | Ehlers et al. ........................ 700/293 |
| 5,801,635 | * | 9/1998 | Price .................................... 340/652 |

FOREIGN PATENT DOCUMENTS 0256815   8/1987 (EP) .

* cited by examiner

*Primary Examiner*—Daniel J. Wu
(74) *Attorney, Agent, or Firm*—Reising, Ethington, Barnes, Kisselle, Learman & McCulloch

(57) ABSTRACT

Apparatus for monitoring interruptions in utility power that includes a utility power plug for connection to a utility wall socket to provide a signal indicative of loss of utility power. A counter is responsive to such signal for counting and displaying the number of power interruptions, and a timer is responsive to such signal for measuring and displaying time duration of power interruptions. An operator switch is coupled to the timer for selectively measuring and displaying either duration of the latest power interruption or total duration of all power interruptions. The counter and timer may be reset at the option of an operator.

21 Claims, 1 Drawing Sheet

POWER INTERRUPTION MONITORING APPARATUS

The present invention is directed to an apparatus for monitoring interruption of utility power, and more particularly to an apparatus for informing an end user or consumer of the nature (i.e., number and/or duration) of power disturbances in a utility power line.

BACKGROUND AND SUMMARY OF THE INVENTION

Providers of utility power have sophisticated computer-implemented systems for monitoring supply of utility power to utility customers. However, there is a need in the art for a simple and inexpensive apparatus that can be employed by a utility customer for monitoring provision of utility power, and for informing the customer of the number and/or duration of power interruptions. A utility power customer may often know that a power interruption has taken place, such as by a blinking display at an alarm clock, VCR or microwave oven. However, the customer does not know from this information how many times power was interrupted, or have any information concerning the duration of power interruptions. Information concerning the duration of power interruptions can be particularly important in connection with equipment sensitive to power interruptions, such as basement sump pumps, medical life support systems and aquarium equipment. It can also be valuable for the customer to have information of this character to supply to the utility power provider to help locate and diagnose sources of power interruption.

It is therefore a general object of the present invention to provide an apparatus for monitoring interruptions in utility power that is particularly well designed and adapted for use by utility power customers. In connection with this objective, another object of the present invention is to provide an apparatus of the described character that is compact, portable and battery-operated, that is inexpensive to manufacture, and that is adapted for use by persons without technical training—i.e., that is user friendly. Another object of the present invention is to provide an apparatus of the described character that includes an audible alarm, which may be selectively disabled by the user, to inform the user of a power interruption. Yet another object of the present invention is to provide an apparatus of the described character that has facility for operator selection of displaying either total duration of power interruptions or duration of the most recent power interruption.

Apparatus for monitoring interruptions in utility power in accordance with a presently preferred embodiment of the invention includes a utility power plug for connection to a utility wall socket to provide a signal indicative of loss of utility power. A counter is responsive to such signal for counting and displaying the number of power interruptions, and a timer is responsive to such signal for measuring and displaying time duration of power interruptions. An operator switch is coupled to the timer for selectively measuring and displaying either duration of the latest power interruption or total duration of all power interruptions. The counter and timer may be reset at the option of the operator.

BRIEF DESCRIPTION OF THE DRAWINGS

The invention, together with additional objects, features and advantages thereof, will be best understood from the following description, the appended claims and the accompanying drawings in which:

DETAILED DESCRIPTION OF PREFERRED EMBODIMENTS

Figure 1:
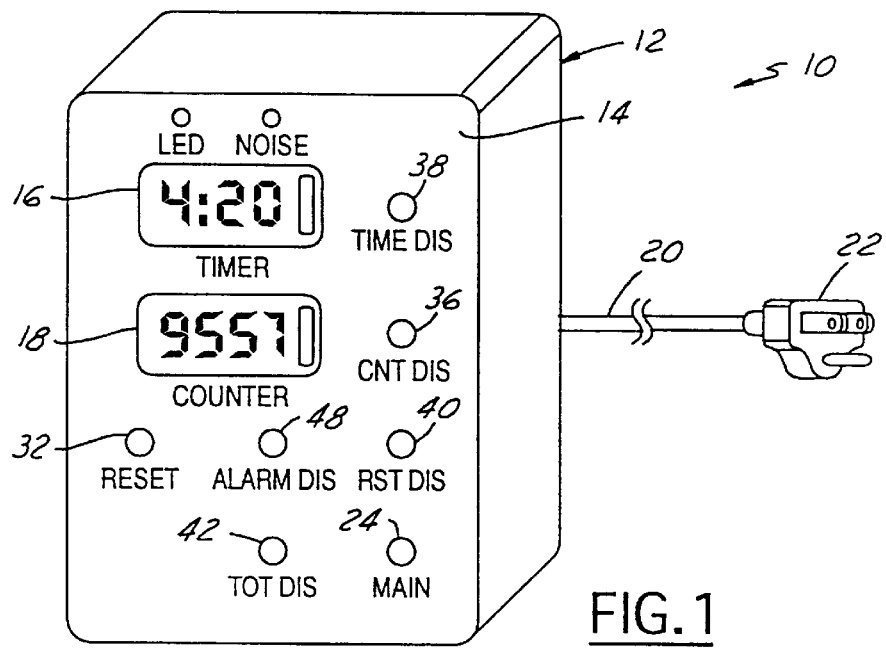
FIG. 1 is a perspective view of apparatus for monitoring interruptions in utility power in accordance with a presently preferred embodiment of the invention.

FIG. 1 illustrates an apparatus 10 for monitoring interruptions in utility power in accordance with a presently preferred embodiment of the invention. A generally rectangular cabinet 12 has a front panel or wall 14 on which a timer 16 and a counter 18 are mounted. Timer 16 and counter 18 preferably each include a digital LCD display. Wall 14 of cabinet 12 also carries a plurality of operator switches to be described in connection with FIGS. 2A and 2B, and a bicolor (red/green) display LED, also to be described in connection with FIGS. 2A and 2B. A line cord 20 extends from the back of cabinet 12, and terminates in a plug 22 suitable for plugging into a standard utility power outlet. Alternatively, plug 22 may be carried on the rear panel of cabinet 12, with the cabinet thus being adapted to be plugged into and suspended from a wall power outlet. Counter 18 and timer 16 preferably comprise conventional components powered by internal batteries. Each component includes an LCD display for digitally displaying the associated count or time.

Figure 2A:
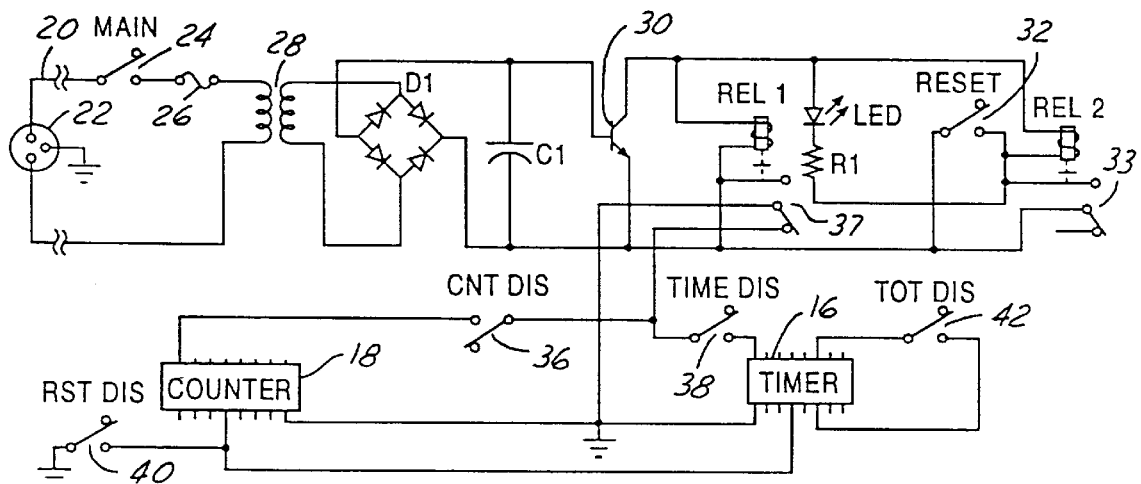
FIGS. 2A and 2B together comprise an electrical schematic diagram of the apparatus illustrated in FIG. 1.

Referring to FIG. 2A, plug 22 and cord 20 are connected through a MAIN power switch 24 and a fuse 26 to a power transformer 28. The secondary of transformer 28 is connected through a rectifying bridge D1 across a capacitor C1. A voltage regulating transistor 30 is connected across capacitor C1 for applying regulated DC voltage to a pair of relays REL1 and REL2. One portion of the LED and a resistor R1 are connected in series across the coil of relay REL2, as are the normally open contacts of a RESET switch 32. A set 33 of normally open contacts of relay REL2 are connected in parallel with RESET switch 32. The normally closed contacts of relay REL1 are connected to the count input of a counter 18 through a counter disable switch 36. The normally closed contacts 37 of relay REL1 are also connected to the enable input of timer 16 through a timer disable switch 38. The reset inputs of counter 18 and timer 16 are connected to a reset disable switch 40. Timer 16 is also connected to a switch 42 for selectively enabling timer 16 to track and display either the total time of power interruption, or the time of the most recent power interruption.

Figure 2B:
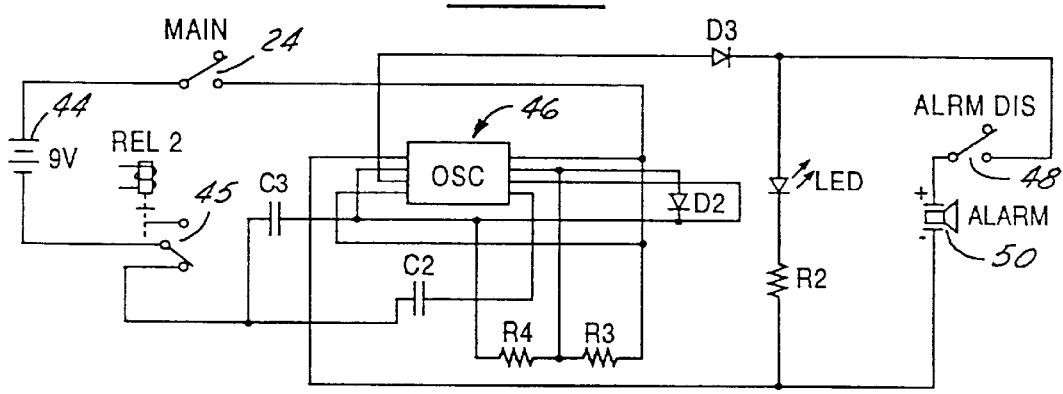

Referring to FIG. 2B, a battery 44 is connected through a second set of contacts of the MAIN power switch 24, and through a set 45 of normally closed contacts of relay REL2, to an oscillator generally indicated at 46. The output of oscillator 46 is connected across a second portion of the LED and a series resistor R2, and through an alarm disable switch 48 to an audible alarm 50. Thus, in the event of utility power loss, oscillator 46 provides a blinking alarm indication at the LED, and provides an audible alarm indication at alarm 50 if alarm disable switch 48 is closed.

In operation, if main power switch 24 is closed in FIGS. 2A and 2B, presence of utility power at plug 22 provides regulated DC power to relays REL1 and REL2. To enable operation, RESET switch 32 is depressed to energize relay REL2. Relay contacts 33 hold relay REL2 energized, and energize the LED at one color (e.g., green), to indicate operation at cabinet wall 14. Contacts 45 of relay REL2 are open so that oscillator 46 is not powered by battery 44. Contacts 37 of relay REL1 are open.

In the event of a power interruption (greater than the actuation times of relays REL1 and REL2, which is preferably at least ten milliseconds), relay REL1 is de-energized so that associated contacts 37 apply input to counter 18 and timer 16 through associated switches 38,36. Counter 18 is thus incremented by one count, and timer 16 begins to time the duration of power interruption. In the meantime, contacts 45 of relay REL2 apply power to oscillator 46, which blinks the LED at a second color (e.g., red), and energizes alarm horn 50 if switch 48 is closed. The circuit of FIG. 1 is designed to distinguish between power interruptions and power reductions. Thus, relays REL1 and REL2 will not de-energize until utility input voltage decreases below about thirty volts (from 120 VAC), which helps distinguish between true power interruptions and "brownouts." In the event that power interruption terminates, relay REL1 will automatically re-energize so as to terminate operation at timer 16. However, relay REL2 will not re-energize until RESET switch 32 is depressed by an operator, meaning that the alarm LED continues to blink and audible alarm 50 will continue to sound if switch 48 is closed. In the event of a second power interruption, relay REL1 will again be de-energized, and counter 18 will again be incremented. Timer 16 will either then begin again to measure the duration of power interruption to provide a cumulative indication of total power interruption time, or if switch 42 is closed will reset and begin timing the latest power interruption. Thus, switch 42 allows the operator to select between measuring total power interruption time, or the time duration of the latest power interruption.

Counter 18 and timer 16 are enabled to be reset by closure of switch 40. Opening of switch 40 prevents accidental reset of the units. Each unit has a built-in reset pushbutton. In the event that apparatus 10 is to be moved to a new utility power outlet, but the operator does not wish to reset the counter and timer, counter disable switch 36 and timer disable switch 38 are opened prior to unplugging plug 38 from the utility power socket. The apparatus may then be moved to a new location and plugged into a new outlet, and switches 36, 38 may be re-closed to enable operation of counter 18 and timer 16.

There is thus provided an apparatus for monitoring interruptions in utility power that fully satisfies the objectives and aims previously set forth. The apparatus is of compact, portable and inexpensive battery-operated construction. The apparatus may be readily used by untrained personnel. There is an audible power-interruption alarm that may be selectively disabled by the user. The user may select between measurement and display of total power interruption time or latest power interruption time at the option of the user.

What is claimed is:

1. Apparatus for monitoring interruptions in utility power comprising:
    means for connection to a source of utility power to provide a signal indicative of loss of utility power at the source,
    means responsive to said signal for counting power interruptions at the source,
    means responsive to said signal for measuring duration of power interruptions at the source,
    a cabinet within which said counting means and duration-measuring means are disposed, said connection means comprising a utility power plug extending from said cabinet, said counting means and said duration-measuring means comprising a counter and a timer on a wall of said cabinet, and
    operator switch means on said cabinet wall for controlling operation of said counting means and said duration-measuring means.

2. The apparatus set forth in claim 1 wherein said plug is on a line cord that extends from said cabinet.

3. The apparatus set forth in claim 1 wherein said duration-measuring means includes a timer and means for resetting said timer.

4. The apparatus set forth in claim 3 wherein said duration-measuring means further includes operator switch means for selectively enabling said timer to measure either duration of the latest power interruption or total duration of all power interruptions.

5. The apparatus set forth in claim 1 further comprising alarm means for indicating a power interruption.

6. The apparatus set forth in claim 5 further comprising operator switch means for selectively disabling said alarm means.

7. Apparatus for monitoring interruptions in utility power comprising:
    a cabinet including a plug extending from said cabinet for connection to a utility power outlet,
    means within said cabinet responsive to utility power for providing a signal indicative of interruptions of utility power at said plug,
    a digital counter mounted on a wall of said cabinet and responsive to said signal for counting and digitally displaying the number of power interruptions at said plug,
    a digital timer mounted on said cabinet wall and responsive to said signal for measuring and digitally displaying duration of power interruptions at said plug, and
    operator switch means on said cabinet wall for controlling operation of said apparatus, including means for selectively enabling said timer to measure either duration of the latest power interruption or total duration of all power interruptions.

8. The apparatus set forth in claim 7 wherein said switch means further includes means for selectively disabling operation of said counter and said timer.

9. The apparatus set forth in claim 8 further comprising alarm means for selectively indicating existence of a power interruption, and wherein said switch means comprises means for selectively disabling operation of said alarm means.

10. The apparatus set forth in claim 9 wherein said alarm means includes a battery, an audible alarm, and means responsive to interruption of utility power for selectively applying power from said battery to said audible alarm.

11. The apparatus set forth in claim 10 wherein said plug is on a line cord that extends from said cabinet.

12. Apparatus for monitoring interruptions in utility power comprising:
    means for connection to a source of utility power to provide a signal indicative of loss of utility power at the source,
    means responsive to said signal for counting power interruptions at the source, and
    means responsive to said signal for measuring duration of power interruptions at the source,
    wherein said signal-providing means includes means for providing said signal when input power is less than a selected threshold, for distinguishing between power reductions and power interruptions.

13. The apparatus set forth in claim 12 further comprising means connected to said duration-measuring means for selectively enabling said duration-measuring means to measure either duration of the latest power interruption or total duration of all power interruptions.

14. The apparatus set forth in claim 12 further comprising a cabinet within which said counting means and duration-measuring means are disposed, said connection means comprising a utility power plug extending from said cabinet.

15. The apparatus set forth in claim 14 wherein said counting means and said duration-measuring means comprise a counter and a timer on a wall of said cabinet.

16. The apparatus set forth in claim 15 further comprising operator switch means on said cabinet wall for controlling operation of said counting means and said duration-measuring means.

17. Apparatus for monitoring interruptions in utility power comprising:

means for connection to a source of utility power to provide a signal indicative of loss of utility power at the source, means responsive to said signal for counting power interruptions at the source, and means responsive to said signal for measuring duration of power interruptions at the source, wherein said duration-measuring means includes a timer, means for resetting said timer, and operator switch means for selectively enabling said timer to measure either duration of the latest power interruption or total duration of all power interruptions.

18. The apparatus set forth in claim 17 wherein said signal-providing means includes means for providing said signal when input power is less than a selected threshold, for distinguishing between power reductions and power interruptions.

19. The apparatus set forth in claim 17 wherein said timer includes a digital display.

20. The apparatus set forth in claim 17 wherein said means for counting interruptions includes a counter and means for selectively resetting said counter.

21. The apparat us set forth in claim 20 wherein said counter includes a digital display.

\* \* \* \* \*